(12) United States Patent
Rak et al.

(10) Patent No.: US 12,035,465 B2
(45) Date of Patent: Jul. 9, 2024

(54) 3D-PRINTED, PCB COMPOSITE STRUCTURES, AND FORMATION METHODS

(71) Applicant: Continental Automotive Systems, Inc., Auburn Hills, MI (US)

(72) Inventors: Stanton F Rak, Evanston, IL (US); David Tseung, Chicago, IL (US)

(73) Assignee: Continental Automotive Systems, Inc., Auburn Hills, MI (US)

( * ) Notice: Subject to any disclaimer, the term of this patent is extended or adjusted under 35 U.S.C. 154(b) by 308 days.

(21) Appl. No.: 17/447,391

(22) Filed: Sep. 10, 2021

(65) Prior Publication Data

US 2023/0094289 A1 Mar. 30, 2023

(51) Int. Cl.
| | |
|---|---|
| H05K 1/02 | (2006.01) |
| B29C 64/118 | (2017.01) |
| B29L 31/34 | (2006.01) |
| B33Y 10/00 | (2015.01) |
| B33Y 80/00 | (2015.01) |
| H05K 1/18 | (2006.01) |
| H05K 3/00 | (2006.01) |
| H05K 3/28 | (2006.01) |

(52) U.S. Cl.
CPC .......... *H05K 1/0284* (2013.01); *B29C 64/118* (2017.08); *B33Y 10/00* (2014.12); *B33Y 80/00* (2014.12); *H05K 1/181* (2013.01); *H05K 3/0044* (2013.01); *H05K 3/284* (2013.01); *B29L 2031/3425* (2013.01); *H05K 2201/09045* (2013.01); *H05K 2203/1305* (2013.01)

(58) Field of Classification Search
None
See application file for complete search history.

(56) References Cited

U.S. PATENT DOCUMENTS

| | | | |
|---|---|---|---|
| 9,748,184 B2 | 8/2017 | Shih et al. | |
| 10,068,832 B2 | 9/2018 | Han et al. | |
| 10,631,405 B1 | 4/2020 | Benedict et al. | |
| 2019/0150271 A1 | 5/2019 | Azadzoi et al. | |
| 2020/0324717 A1* | 10/2020 | Raychaudhuri | .......... H01B 1/22 |

FOREIGN PATENT DOCUMENTS

CN 105704934 A 6/2016

* cited by examiner

*Primary Examiner* — Timothy J Thompson
*Assistant Examiner* — John B Freal

(57) ABSTRACT

A three-dimensional (3D) printed circuit board (PCB) composite structure includes a PCB and a 3D printed composite structure. The printed circuit board includes a plurality of grooves milled in a surface of the PCB, and retaining walls of the 3D printed composite structure are deposited within the plurality of grooves in the surface of the PCB, to improve adhesion of the 3D printed composite structure to the PCB.

4 Claims, 10 Drawing Sheets

3D-PRINTED, PCB COMPOSITE STRUCTURES, AND FORMATION METHODS

BACKGROUND

1. Field

The present application relates to the protection of electronics mounted to a circuit board, and more particularly to a three-dimensional (3D) printed circuit board (PCB) composite structure for retaining encapsulant protective of an electronic component mounted to the PCB and a method of manufacturing the 3D PCB composite structure.

2. Description of Related Art

Conventionally, electronics components mounted to a substrate, such as a printed circuit board (PCB) are expected to reliably operate in harsh environments at relatively low cost. For example, with respect to automotive applications, door and window control modules may be required to safely function for a specified amount of time even when the door and window control modules may be submerged in water.

Meanwhile, safety, communication, and display advances are driving miniaturization and integration of various devices onto a PCB assembly, such as cameras, sensors, light emitting diodes (LEDs), and the like. Accordingly, electrification trends are leading to higher voltage requirements for components mounted to the PCB.

In general, electronics mounted to a PCB assembly may be encapsulated within a retaining dielectric gel. Either the entire PCB assembly may be encapsulated within the dielectric gel, or alternatively only specific electronics components mounted to the PCB may be encapsulated within a specially designed housing. The dielectric gel may be filled within the housing to completely encapsulate the electronics components to be protected from fluids including water, dirt, gases, arcing from other electronics components, and other environmental conditions.

Consequently, an efficient and cost-effective solution providing the integration and protection of critical functionality of electronics components on a PCB assembly would be desirable.

SUMMARY

Aspects of embodiments of the present application relate to a three-dimensional (3D) printed circuit board (PCB) composite structure for retaining encapsulant protective of an electronic component mounted to the PCB and a method of manufacturing the 3D PCB composite structure. The 3D-printed PCB composite structure may encompass an area, and therefore the encapsulant protection as well, of one or more mounted electrical components and circuits. As circuit traces may be formed when the PCB itself is fabricated, protection afforded by the 3D-printed PCB composite structure may be provided for electronic components depending on the PCB design layout. Protection can be of mounted electronic components and the conductive traces (or elements) required for the interconnection of the electronic components. The conductive elements themselves could also serve as an electronic component in some cases, such as fuses. Accordingly, localized protection of electronic components and circuits mounted to or formed on the surface of a circuit board may be surely provided.

According to an aspect of an embodiment, there is provided a three-dimensional (3D) printed circuit board (PCB) composite structure for retaining encapsulant protective of an electronic component mounted to the PCB.

According to an aspect of an embodiment, there is provided a method of manufacturing the 3D PCB composite structure.

BRIEF DESCRIPTION OF THE DRAWINGS

The above and other aspects will be more clearly understood from the following brief description taken in conjunction with the accompanying drawings, in which.

DETAILED DESCRIPTION

Figure 1A:
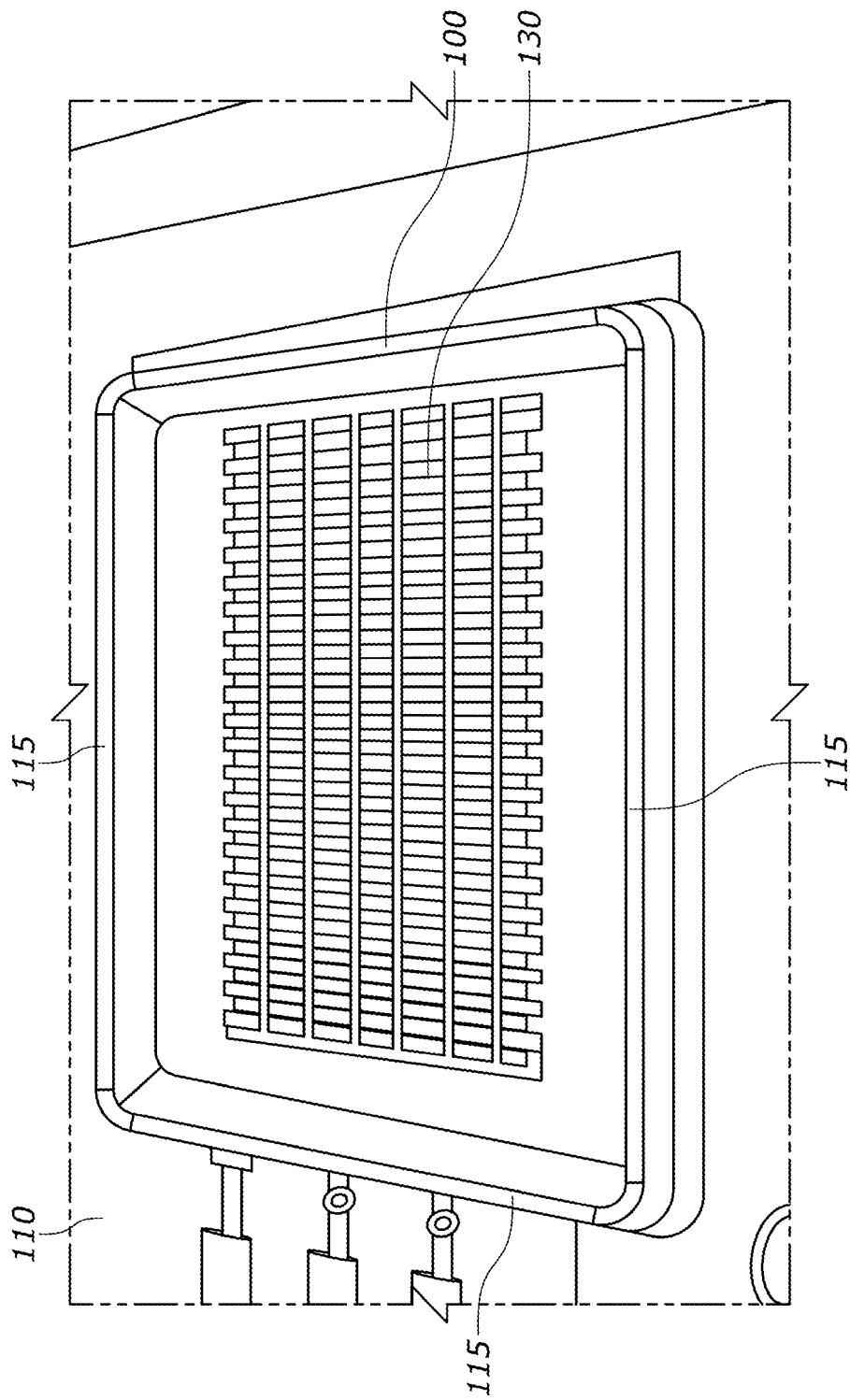
FIG. 1 is a diagram illustrating a three-dimensional (3D) printed circuit board (PCB) composite structure for retaining encapsulant protective of an electronic component mounted to the PCB, according to an embodiment.
Figure 1B:
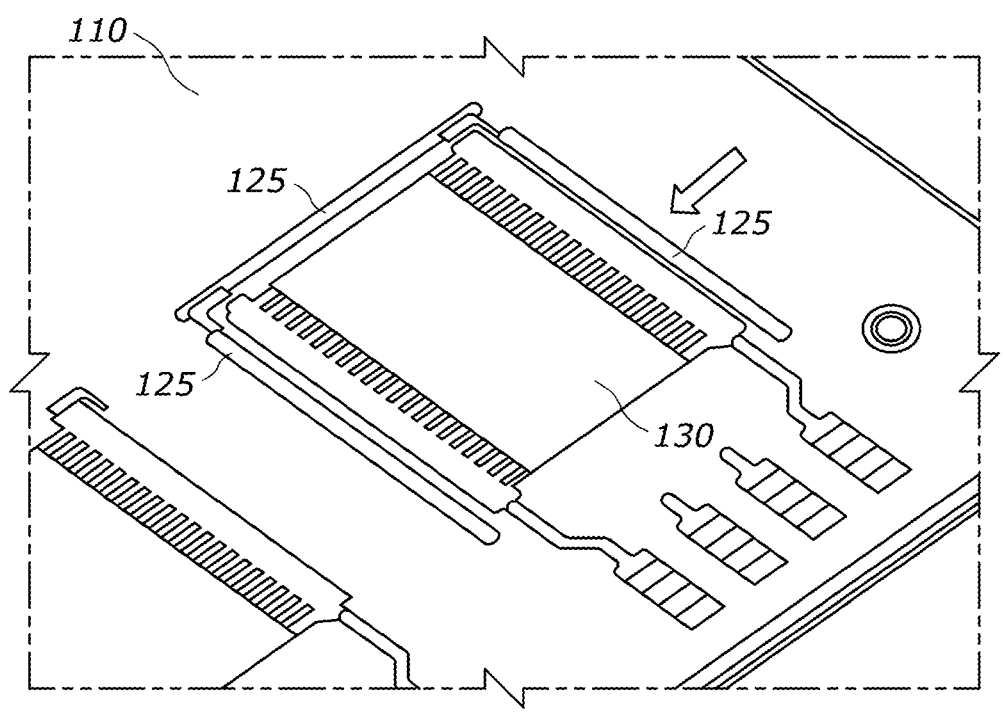

FIGS. 1A and 1B are diagrams illustrating a three-dimensional (3D) printed circuit board (PCB) composite structure for retaining encapsulant protective of an electronic component mounted to the PCB, according to an embodiment.

FIGS. 1A and 1B illustrate a three-dimensional (3D) printed composite structure 100 on a printed circuit board (PCB) assembly 110.

As illustrated in FIG. 1A, the 3D-printed composite structure 100 includes one or more retaining walls 115. The quantity of the retaining walls 115 may depend on a shape of the 3D-printed composite structure 100. For example, in the shape of a square or rectangle, the 3D-printed composite structure 100 may include four retaining walls 115. However, the shape of the 3D-printed composite structure 100 may include any geometric shape according to a shape of the electronic component to be encapsulated.

The retaining walls 115 of the 3D-printed composite structure 100 act as a barrier for retention of an encapsulant, such as a dielectric gel, which encapsulates an electronic component mounted to the PCB 110. The retaining walls 115 of the 3D-printed composite structure 100 prevent an encapsulant from spreading uncontrollably across the surface of the PCB 110 to which the electronic component is mounted, while enabling for sufficient height of the encapsulant to cover the sensitive electronic circuitry.

Accordingly, the 3D-printed composite structure is superior in that no additional parts, fasteners (adhesives), dispense machines, or cure processes, are required to create the 3D-printed composite structure 100.

As illustrated in FIG. 1B, the PCB 110 includes one or more grooves 125. The one or more grooves 125 may correspond to the retaining walls 115, such that the retaining walls 115 may be deposited onto the PCB 110 at locations of the grooves 125. Accordingly, the grooves 125 may be provided in the PCB 110 based on the shape of the electronic component 130 to be encapsulated. For example, in the shape of a square or rectangle, the grooves 125 in the PCB 110 may include four grooves 125. However, the shape of the grooves 125 may include any geometric shape according to a shape of the electronic component 130 to be encapsulated.

Alternatively, the quantity of the grooves 125 in the surface of the PCB 110 may not entirely correspond to the locations of the retaining walls 115. For example, in the shape of a square or rectangle, the grooves 125 in the PCB 110 may include three grooves 125, which correspond to three of four of the retaining walls 115.

The PCB 110 may be milled to create the grooves 125 in the surface of the PCB 110 around the area to be protected at which the electronic component is to be mounted to the PCB 110. The grooves 125 may be milled at a factory supplier at a time of routing the PCB 110, or subsequent to manufacture of the PCB 110.

A milling depth of the grooves 125 below a surface of the PCB 110 may be, for example, 0.1 mm to 1 mm. Accordingly, a depth of the grooves may be preferably selected with respect to one or more of a thickness or rigidity of the PCB 110, a height of the retaining walls 115, and a width of the retaining walls 115, to ensure sufficient anchoring of the retaining walls 115 to the PCB 110.

A width of the grooves 125 in the surface of the PCB 110 may be, for example, 0.1 mm to 1 mm. Accordingly, a width of the grooves may be preferably selected with respect to one or more of a thickness or rigidity of the PCB 110, a height of the retaining walls 115, and a width of the retaining walls 115.

Extrusion of filament into the grooves 125 may be performed to build the grooves 125 upwards or away from a surface of the PCB 110. Through deposition of filament into the grooves, mechanical anchoring of the retaining walls 115 within a surface of the PCB 110, which may include epoxy, a glass laminate region, or other compounds, may be achieved.

Figures 2A, 2B:
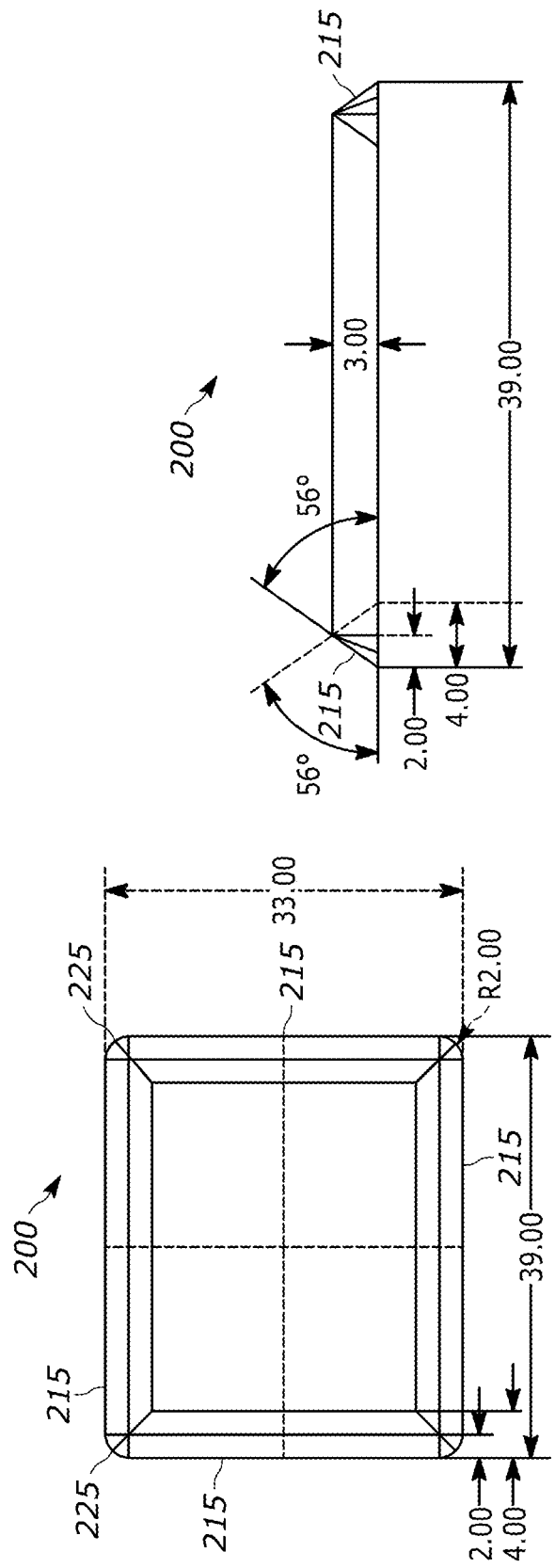
FIG. 2A illustrates a top view of a three-dimensional (3D) printed composite structure, which may be printed on a printed circuit board (PCB) assembly.
FIG. 2B illustrates a side view of a three-dimensional (3D) printed composite structure, which may be printed on a printed circuit board (PCB) assembly.

FIGS. 2A and 2B are schematic diagrams illustrating a three-dimensional (3D) printed circuit board (PCB) composite structure, according to an embodiment.

FIG. 2A illustrates a top view of a three-dimensional (3D) printed composite structure 200, which may be printed on a printed circuit board (PCB) assembly. FIG. 2B illustrates a side view of a three-dimensional (3D) printed composite structure 200, which may be printed on a printed circuit board (PCB) assembly.

The 3D-printed composite structure 200 includes one or more retaining walls 215. A shape of the retaining walls 215 may be sloped from an exterior edge of the retaining wall 215 towards an interior edge of the retaining walls 215. Accordingly, the shape of the retaining wall 215 may be continuously sloped—from a lower portion of the retaining wall 215 at which the retaining wall extends from the surface of the PCB to an upper portion of the retaining wall 215, at which the distal end of the retaining wall 215 terminates extension from the surface of the PCB. As a result, the retaining wall 215 includes a tapered structure from an outer edge of the retaining wall 215 towards an inner edge of the retaining wall. Such smoothing of the retaining walls 215 may reduce stress on the retaining walls 215 and improve adhesion of the 3D-printed composite structure 200 to the PCB.

As illustrated in FIG. 2B, a height of the retaining wall 215 may be 3 mm, and a slope or tapering angle of the retaining wall may be 56 degrees. As illustrated in FIGS. 2A and 2B, a width or thickness of the retaining wall may be 4 mm, and a length of the retaining wall may be 33 mm or 39 mm. However, the dimensions of the retaining walls 215 are merely exemplary, and other dimensions of the retaining walls 215 may be selected to optimize coplanarity and adhesion of the 3D-printed composite structure 200 to the PCB.

The retaining walls 215 of the 3D-printed composite structure may also include rounded corners 225. As illustrated in FIG. 2A, a rounded corner may have a radius of about 2 mm. Rounding of the corners 225 of the retaining walls 215 may further reduce stress on the retaining walls 215, improve adhesion of the 3D-printed composite structure 200 to the PCB, and prevent warping of the retaining walls 215. Accordingly, the 3D-printed composite structure 200 surrounds the perimeter of the electronic component so that a liquid encapsulant can be easily filled within the enclosed area encompassed by the 3D-printed composite structure 200.

Figure 3:
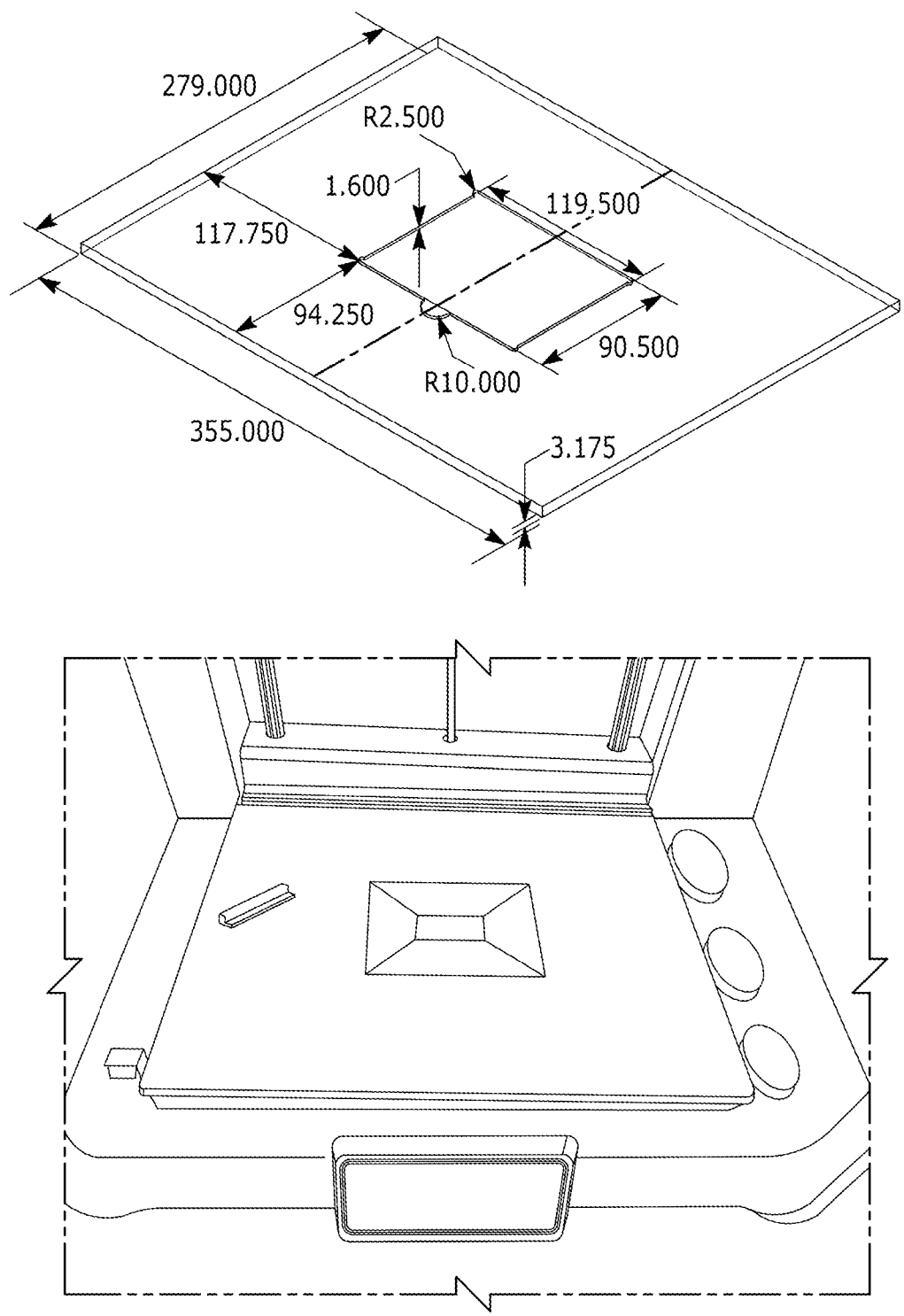
FIG. 3 illustrates a build plate for producing a 3D-printed composite structure, according to an embodiment.

FIG. 3 illustrates a build plate for producing a 3D-printed composite structure, according to an embodiment.

For deposition of materials, three-dimensional (3D) printers that utilize plastic filaments are known as fused filament fabrication (FFF) or fused deposition modeling (FDM) printers. These types of 3D printers may have a low procurement cost.

A 3D-printed object may be traditionally printed directly onto a heated glass plate of a 3D printer. This plate is known as the build plate or "bed." Typically, a "brim" is printed to provide support and adhesion of the object to the build plate. After the 3D printing process is complete, the printed object is removed from the plate.

However, the brim increases the area of the 3D-printed object, which reduces the space available for components mounted to a PCB. Accordingly, the brim may be omitted to allow for more space on the PCB for electronic components, when directly printing to the PCB, but this reduces adhesion to the build plate.

According to an embodiment, the build plate may be fabricated out of aluminum-2024, or another suitable heat conducting material, having a milled recess to position the PCB, as illustrated in FIG. 3. Aluminum-2024 is thermally stable and not prone to warpage. The aluminum metal acts to transfer heat, which may be more effective than glass, to the PCB to aid in the printing process. A thermal interface material may also be placed between the milled recess and the PCB to aid in heat transfer to the PCB surface.

The aluminum build plate may be utilized directly with a commercial 3D-printer, and may be compatible with an active leveling program of a 3D-printer, even after multiple cycles. Additionally, the 3D-printer may include a temperature-controlled, enclosed area in which the 3D-printed composite structure is generated.

In an experiment, an Ultimaker S5, which employs fused filament fabrication, was utilized. The Ultimaker S5 is an open source 3D-printer compatible with third-party filament materials. The filaments and their printing temperatures are listed within Table 1.

TABLE 1

| | Filament Information | | | | |
| --- | --- | --- | --- | --- | --- |
| | | | Printing Temperature | | Baking |
| | Filament Details | | Nozzle Temp | Bed Temp | Temperature |
| Type | Manufacturer | Product | (° C.) | (° C.) | (° C.) |
| PLA | Ultimaker | Tough PLA | 220 | 60 | 55 |
| ABS | 3DXTECH | ESD ABS | 240 | 110 | 80 |
| PETG | Ultimaker | CPE+ | 260 | 110 | 80 |

Each material was dried at its respectively baking temperature for four hours before printing.

Open-source software, such as Cura, was used to adjust printing settings and to slice models. Table 2 lists two sets of parameters that were used for the prints. The main difference is the size of the nozzle, which directly influences the amount of extruded material. Although there exists many settings to consider, the listed settings focus on the condition of the initial layer. The initial layer is critical to establish adhesion as will be described below.

TABLE 2

| Printing Settings | | |
| --- | --- | --- |
| | Printing Settings | |
| Nozzle Type | CC .6 mm | AA .8 mm |
| Layer Height | .25 mm | .4 mm |
| Line Width | .525 | .7 |
| Initial Line Width Multiplier | 120% | 120% |
| Infill | 50% | 50% |
| Initial Layer Speed | 10 mm/s | 10 mm/s |
| Layer Speed | 30 mm/s | 30 mm/s |
| Z-Offset | −.1 mm | −.1 mm |
| Print Time | ~6 min | ~4 min |

Utilizing the parameters above and the grooved surface PCB, a 3D-printed composite structure with a watertight seal with the surface of the PCB and a good adhesive ability to withstand minor mechanical shocks may be obtained.

To establish a baseline for adhesion, acrylonitrile butadiene styrene (ABS) was printed directly onto a PCB, which was not modified in any way. This resulted in very poor adhesion, and the 3D-printed composite structure was able to be removed with minimal shear force of about 5 lbf, which was too low to withstand minor mechanical shocks that the PCB may experience.

To improve contact of the initial layer of material on the PCB, an ABS/acetone mixture was used to prepare the PCB surface. Acetone is capable of partially dissolving ABS. For fused filament fabrication, a mixture of ABS/acetone may be spread directly onto the build plate bed to increase the adhesion of an ABS print. In this case of a PCB as a print surface, before printing, a thin coating of the ABS/acetone mixture was spread around the border of the PCB component circuit pattern. As the thin coating was heated, the acetone evaporated, which left a layer of ABS. This layer acted as a foundation for the 3D printer to print the 3D-printed composite structure.

FIGS. 4, 5, 6, 7, 8, and 9 are graphs illustrating shear force testing measurements, according to an embodiment.

Figure 4:
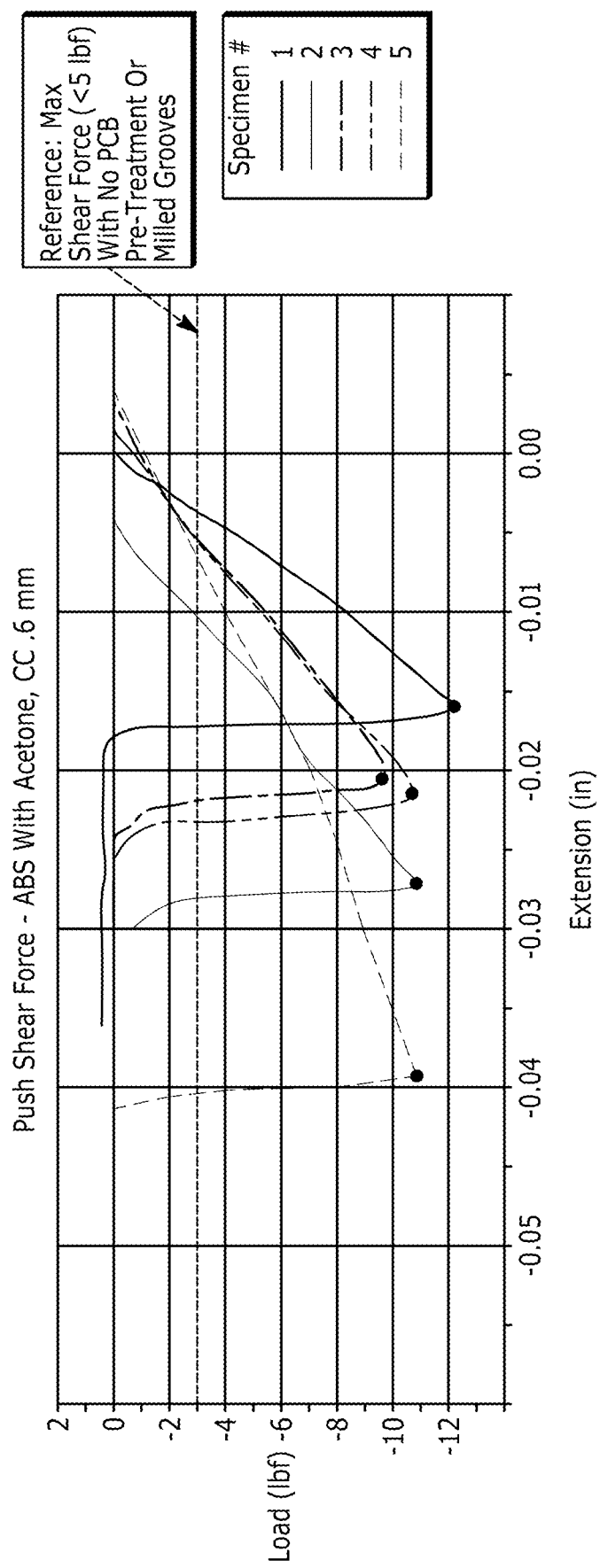
FIGS. 4, 5, 6, 7, 8, and 9 are graphs illustrating shear force testing measurements, according to an embodiments.

With the addition of the ABS/Acetone PCB surface pretreatment, the average shear force to dislodge the 3D-printed composite structure increased to about 10 lbf, as illustrated in FIG. 4, from about 5 lbf without any PCB surface treatment.

However, it may be suboptimal to use the solvent to prepare the PCB surface, as the acetone may result in adverse reactions which may hinder the reliability of the circuit. Also, this specific solvent will not dissolve all thermoplastics. More aggressive chemicals may be necessary depending on the plastic type.

Next, a mechanical bond may be created by physically modifying the PCB. The perimeter of the component circuit pattern may be milled to create thin grooves around, for example, three or more sides of the PCB component circuit pattern. The grooves may have a width of 0.8 mm and a depth of 1.0 mm.

The 3D-printing material can be extruded into the grooves, creating additional points of mechanical "lock & key" or "anchoring" within the PCB epoxy/glass laminate region. Here, improved adhesion may be attained through attractive molecular forces of the glass fiber surface and the printed plastic.

Accordingly, the plastic filament may be extruded directly into the thin grooves. The grooves can easily be created at the PCB suppliers' factories at the same time the panels are routed/milled for singulation.

In addition to the print parameters, the ratio of extrusion nozzle diameter to the groove width is important for maximizing structural adhesion. Printing with a 0.6 mm nozzle into a 0.8 mm groove yields the shear force data shown in FIG. 5. As shown therein, there is a notable amount of variance between test specimens, with all values greater than 20 lbf. This compares favorably to the 10 lbf for the ABS/acetone PCB pretreatment method and 5 lbf for no surface treatment illustrated in FIG. 4.

To maximize the potential benefits of the grooves, additional specimens were produced using an 0.8 mm diameter extrusion nozzle that matched the width of the PCB grooves. Additional plastic filaments were also evaluated. Printer variables including z-offset and print speed were held constant.

Figure 5:
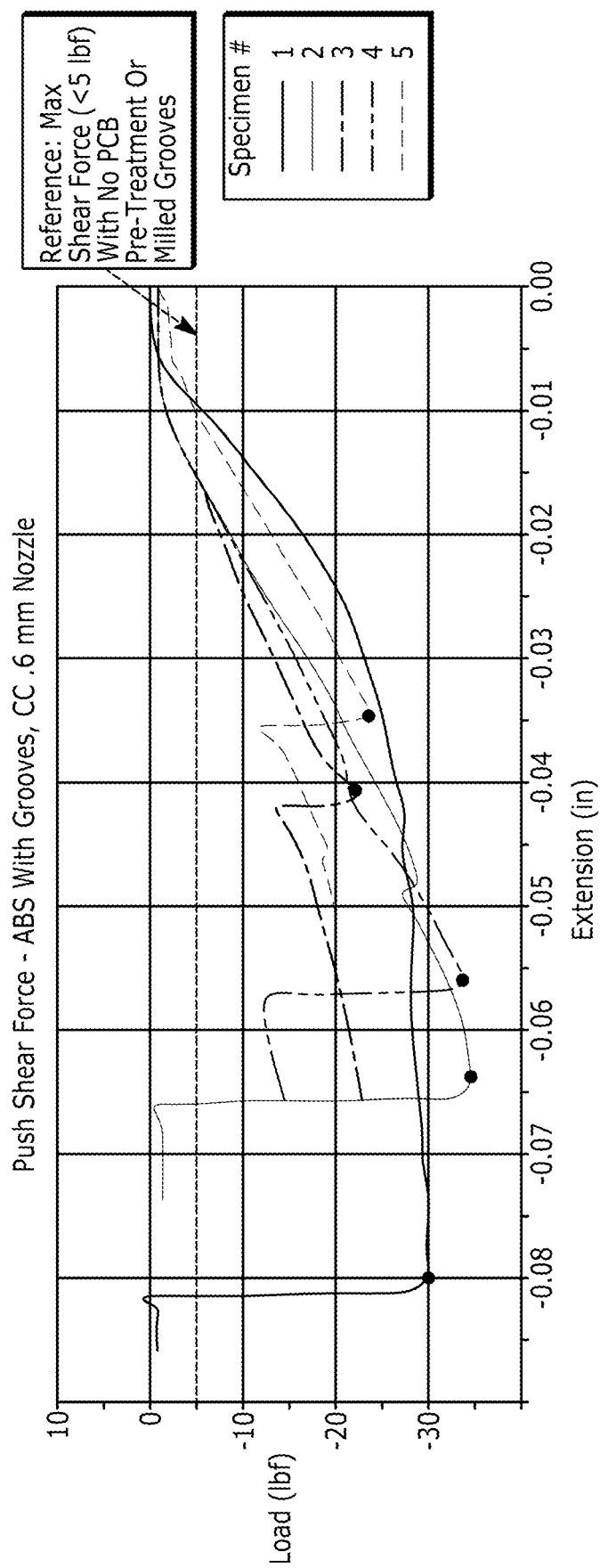
Figure 6:
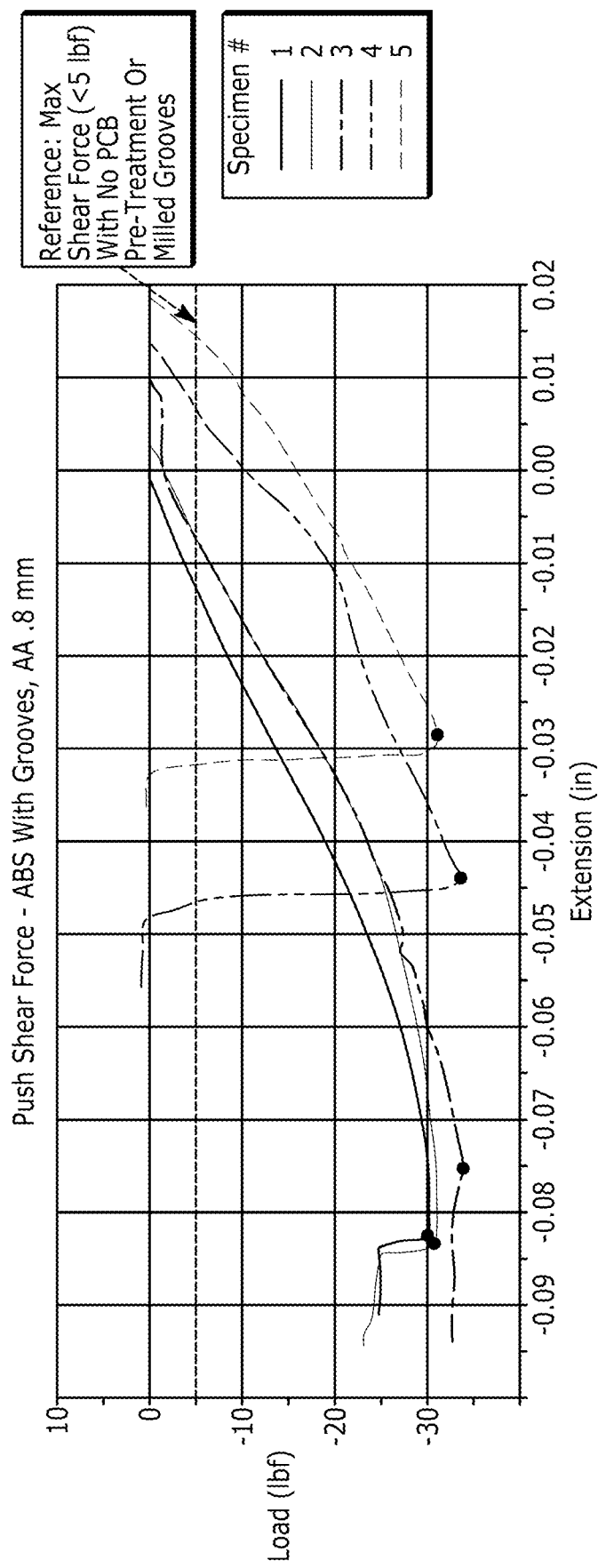
Figure 7:
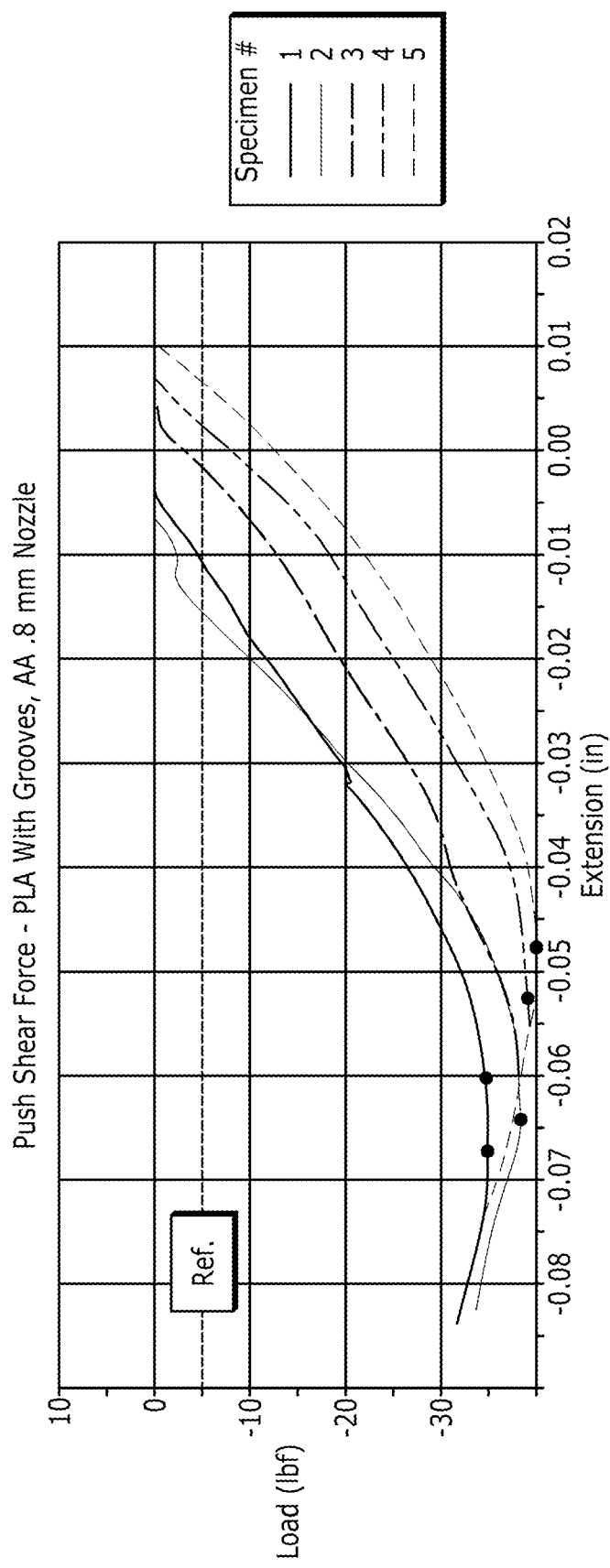

FIG. 6 shows that the 0.8 mm nozzle together with ABS filament provides consistent and higher shear force values, exceeding 30 lbf, as compared with FIGS. 4 and 5. As the grooves are filled completely, using the 0.8 mm diameter extrusion nozzle along with the same z-offset and print speed as used for the 0.6 mm nozzle. Thus, matching nozzle diameter to groove width is an additional design-for-print parameter.

The same design-for-print methodology that had been implemented for ABS plastic, was repeated for the plastic filaments, PLA and CPE+, to demonstrate whether the success described above was material specific to ABS. The shear force data presented in FIG. 7 for PLA filament and in FIG. 8 for CPE+ filament. Unlike the ABS samples, the 3D-printed composite structure did not detach from the PCB for PLA and CPE+. Instead, the 3D-printed composite structure remained in place, while the material deformed from the applied force. This occurrence is reflected within FIGS. 7 and 8, in which there is no instantaneous change in load. For this reason, FIGS. 7 and 8 may be more representative of the materials' mechanical strength, rather than its adhesive ability.

Figure 8:
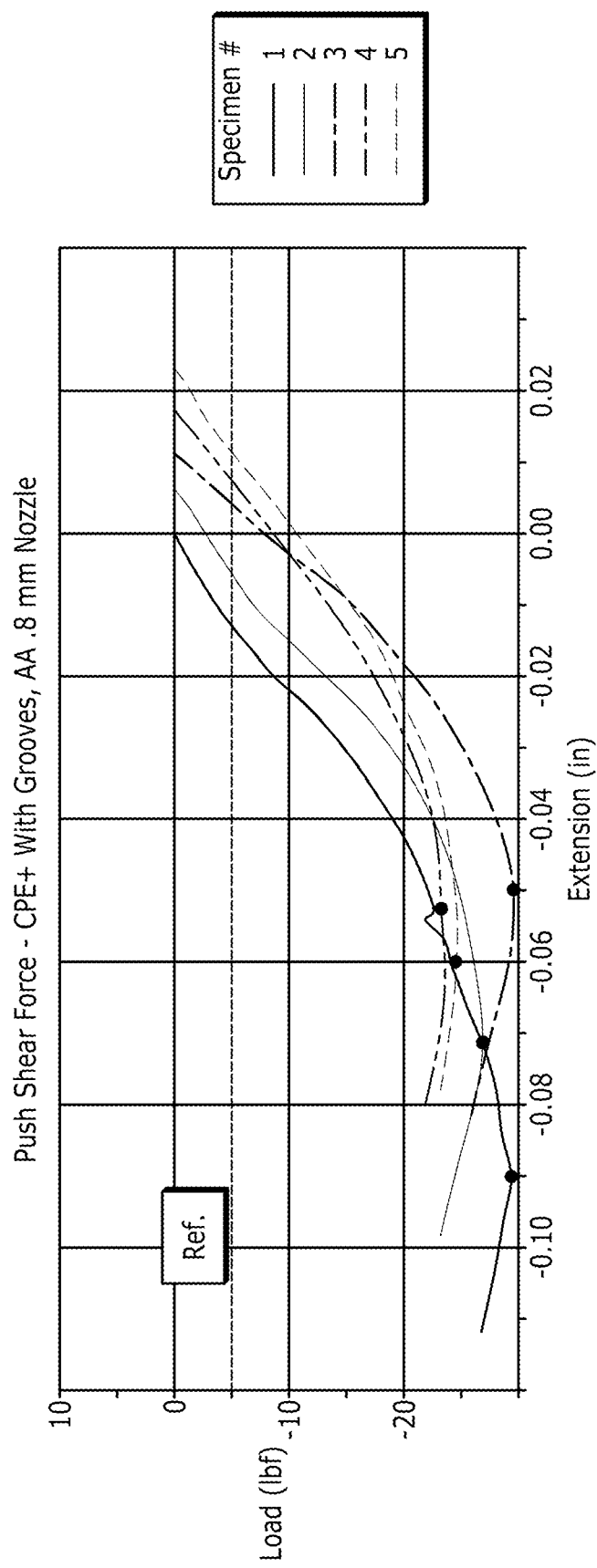
Figure 9:
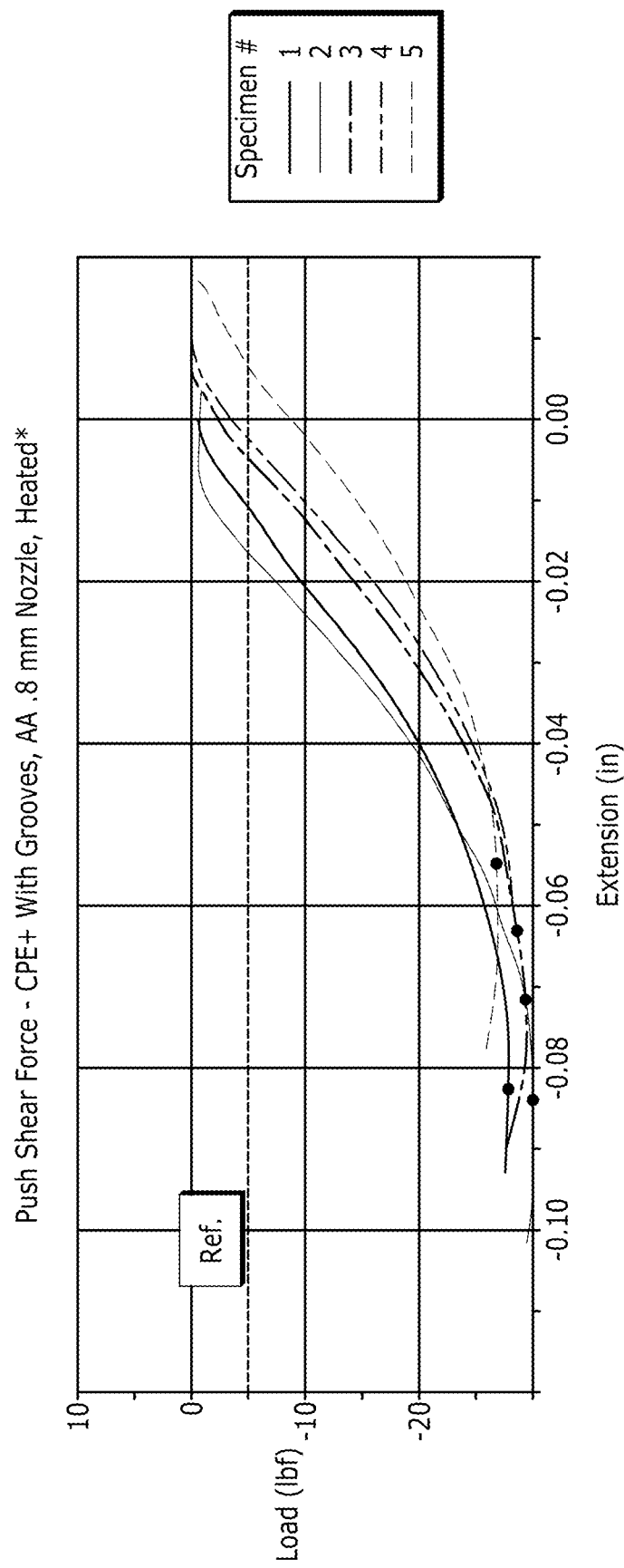

FIG. 8 illustrates that the 0.8-mm nozzle together with CPE+ filament also gave very consistent shear values, of about 23 to 30 lbf. The CPE+ has higher temperature stability and is also flexible so the shear force data are not indicative of the loss of adhesion, but instead, of the deformation of the CPE+ plastic material itself.

Impact of post-print, heating on the adhesion of PCB composite structures was also investigated. Some liquid dispensed encapsulants require heat for curing. To investigate the impact of temperature on adhesion of the printed structure, CPE+/PCB composite structures were heated to 100 degrees Celsius for 1 hour. Next, the PCBs were cooled to room temperature and shear force tested in the same manner as the specimens without the post, heat treatment. As observed in FIG. 9, the shear force failures were consistent and all between 25-30 lbf, indicating that no degradation was caused by the thermal exposure.

A summary of adhesion performance due to PCB surface preparation method, nozzle diameters, and plastic filament types appears in Table 3.

TABLE 3

Summary of adhesion performance due to PCB surface preparation method, nozzle diameters, and plastic filament types.

| (FFF) Plastic Filament type | PCB Preparation Method/ 3D-Print Extruder Nozzle | Average Maximum Shear Force (lbf) |
| --- | --- | --- |
| ABS | No surface preparation (reference)/ CC 0.6-mm nozzle | ≤5 (fails with contact) |
| ABS | ABS + Acetone deposited film/ CC 0.6-mm nozzle | 11 |
| ABS | PCB Grooves/0.6-mm nozzle | 25 |
| ABS | PCB Grooves/AA 0.8-mm nozzle | >32 (cracked) |
| PLA | PCB Grooves/AA 0.8-mm nozzle | >37 (deformed) |
| CPE+ | PCB Grooves/AA 0.8-mm nozzle | >26 (deformed) |
| CPE+ | PCB Grooves/AA 0.8-mm nozzle; Thermal aged, 1-hr @ 100 C., after 3D printing | >28 (deformed) |

Accordingly, as listed in Table 1 and Table 2, various combinations of 3D-printing parameters may be implemented to improve adhesion and shear strength of the 3D-printed composite structures including nozzle type, nozzle diameter, nozzle temperature, recessed-aluminum bed geometry and temperature, print layer height, print line width, initial line width multiplier, infill, initial layer print speed, subsequent layer print speed, print head z-offset, and print time. Note that the print time listed in Table 2 was not necessarily optimized for high-volume manufacturing environments. Consequently, the 3D-printing parameters may be appropriately configured to account for the non-planar nature of the surface of the PCB, which includes the milled grooves, as a build plate for 3D printing of the 3D-printed composite structure.

As described above, adhesion of the 3D-printed composite structure may be improved. Accordingly, a low cost and effective solution to encapsulating electronic components on a PCB may be attained.

Although various embodiments have been described, the techniques herein are not limited to retaining walls for encapsulants. Other structures may also be printed directly onto PCBs, using the methodology described within, which may be used to position and to retain cameras, LEDs, sensors, optics, connectors, odd-shaped components, and other devices undergoing integration into electronic assemblies.

The invention claimed is:

1. A three-dimensional (3D) printed circuit board (PCB) composite structure comprising:
    a PCB, the PCB comprising a plurality of grooves in a surface of the PCB;
    a 3D printed composite structure printed on the PCB at locations of the plurality of grooves in the surface of the PCB an electronic component mounted to the surface of the PCB within the 3D printed composite structure; and
    an encapsulant within the 3D printed composite structure, the encapsulant covering the electronic component,
    wherein the 3D printed composite structure comprises a plurality of retaining walls deposited in the plurality of grooves in the surface of the PCB.

2. A method of manufacturing a three-dimensional (3D) printed circuit board (PCB) composite structure, the method comprising:
    forming a plurality of grooves in a surface of the PCB;
    forming the 3D printed composite structure printed on the PCB at locations of the plurality of grooves in the surface of the PCB; and
    depositing an encapsulant within the 3D printed composite structure,
    wherein forming the 3D printed composite structure on the filament deposited in the plurality of grooves comprises:
        depositing a filament in the plurality of grooves;
        forming the 3D printed composite structure on the filament deposited in the plurality of grooves; and
        forming a plurality of retaining walls of the 3D printed composite structure on the filament deposited in the plurality of grooves in the surface of the PCB.

3. The method of claim 2, further comprising mounting the electronic component to the PCB.

4. The method of claim 3, wherein depositing the encapsulant within the 3D printed composite structure comprises depositing the encapsulant within the plurality of retaining walls of the 3D printed composite structure to cover the electronic component mounted to the PCB within the 3D printed composite structure.

* * * * *